(12) United States Patent
Bandyopadhyay

(10) Patent No.: US 9,716,470 B2
(45) Date of Patent: Jul. 25, 2017

(54) APPARATUS AND METHODS FOR COMPENSATING AN OPERATIONAL AMPLIFIER

(71) Applicant: Analog Devices, Inc., Norwood, MA (US)

(72) Inventor: Abhishek Bandyopadhyay, Winchester, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/719,221

(22) Filed: May 21, 2015

(65) Prior Publication Data
US 2016/0344344 A1 Nov. 24, 2016

(51) Int. Cl.
H03F 1/02 (2006.01)
H03F 3/45 (2006.01)
H03F 3/30 (2006.01)

(52) U.S. Cl.
CPC ......... *H03F 1/0205* (2013.01); *H03F 3/3022* (2013.01); *H03F 3/45085* (2013.01); *H03F 3/45183* (2013.01); *H03F 3/45192* (2013.01); *H03F 2203/45028* (2013.01); *H03F 2203/45116* (2013.01); *H03F 2203/45134* (2013.01); *H03F 2203/45248* (2013.01)

(58) Field of Classification Search
USPC .................................. 330/252–261, 292, 76
See application file for complete search history.

(56) References Cited

U.S. PATENT DOCUMENTS

| | | | |
|---|---|---|---|
| 6,211,738 B1 | 4/2001 | Hecht | |
| 6,911,858 B2 * | 6/2005 | Mori | .................... H03F 3/45183 327/307 |
| 8,816,773 B2 | 8/2014 | Gerstenhaber et al. | |
| 9,071,205 B2 * | 6/2015 | Rey-Losada | .......... H03F 3/3022 |
| 2013/0021097 A1 | 1/2013 | Adams et al. | |

OTHER PUBLICATIONS

Saxena et al., "Compensation of CMOS Op-amps Split-Length Transistors", 2008, pp. 109-112, IEEE.

\* cited by examiner

*Primary Examiner* — Hieu Nguyen
(74) *Attorney, Agent, or Firm* — Knobbe Martens Olson & Bear LLP

(57) ABSTRACT

Provided herein are apparatus and methods for compensating an operational amplifier (op-amp). In certain configurations, a compensation network is electrically connected between an output node of the op-amp and an input differential pair coupled source/emitter tail-current node. The compensation network can include a capacitor having a relatively low value of capacitance. In this manner, op-amp bandwidth is improved while power consumption is reduced to meet a "green" standard.

22 Claims, 5 Drawing Sheets

APPARATUS AND METHODS FOR COMPENSATING AN OPERATIONAL AMPLIFIER

BACKGROUND

Field

Embodiments of the invention relate to electronic circuits, and more particularly, to operational amplifiers.

Description of the Related Technology

An operational amplifier (op-amp) is an amplifier designed for use with external feedback elements to perform a variety of functions or operations. In one application several op-amps are arranged to serve as an instrumentation amplifier. In another application an op-amp is used to create a stable reference voltage. In yet another application, an op-amp is used to buffer a high-frequency signal.

SUMMARY

One aspect of this disclosure is an amplifier comprising a differential transistor input pair having a first transistor and a second transistor. The first transistor and the second transistor are electrically connected to a coupling node. The amplifier also comprises an amplification stage having an input electrically connected to the differential transistor input pair and an output. A compensation network is electrically connected between the output and the coupling node.

A tail current is provided by a circuit element electrically connected to the coupling node. The circuit element can be an FET having a drain electrically connected to the coupling node. In addition, the first transistor and the second transistor can both be FET transistors, or they can both be BJTs.

The compensation network can comprise passive and/or active components. The compensation network can comprise a capacitor, or it can comprise a capacitor and a resistor connected in series. Alternatively, an active device such as an FET can be electrically connected in series with the capacitor.

In another aspect an amplifier comprises a differential transistor pair; and each transistor has a control terminal, a first end and a second end. One of the first ends comprises an output. The second end of the first transistor and the second end of the second transistor are coupled to a common node. Input signals on the control terminals control the flow of current between the first end and the second end. The amplifier further comprises an amplifier stage having inputs that receives output signals from outputs of the transistors of the differential transistor pair and then provides a first amplified output. A feedback network interconnects the first amplified output to the common node of the differential pair so as to increase a power supply rejection ratio with respect to a supply voltage rail.

The common node can be electrically connected to a circuit element operating as a current source to provide a tail current to the differential pair. The differential pair can comprise a pair of NMOS or PMOS transistors; and the common node can be a node interconnecting the sources of the transistors such that a power supply rejection ratio with respect to a supply rail is increased. When the differential pair comprises a pair of NMOS transistors, the power supply rejection ratio with respect to a positive supply rail is increased; and when the differential pair comprises a pair of PMOS transistors, the power supply rejection ratio with respect to a negative supply rail is increased.

The differential pair can alternatively comprise a pair of NPN or PNP transistors; and the common node can be a node interconnecting the emitters of the transistors such that a power supply rejection ratio with respect to a supply rail is increased. When the differential pair comprises a pair of NPN transistors, the power supply rejection ratio with respect to a positive supply rail is increased; and when the differential pair comprises a pair of PNP transistors, the power supply rejection ratio with respect to a negative supply rail is increased.

The feedback network can comprise a compensation network. The compensation network can include a capacitor, a capacitor and a resistor connected in series, and/or a capacitor and a CMOS transistor connected in series. The capacitor and the capacitor and the resistor can be connected in parallel.

The amplifier can comprise a second feedback network, wherein the amplifier stage further provides a second amplified output such that the second amplified output and the first amplified output operate as a differential output. The second feedback network can interconnect the second amplified output to the common node of the differential pair so as to increase a power supply rejection ratio with respect to the supply voltage rail. The amplifier can further be a folded cascode amplifier configured to operate as a class AB amplifier.

BRIEF DESCRIPTION OF THE DRAWINGS

These drawings and the associated description herein are provided to illustrate specific embodiments of the invention and are not intended to be limiting.

DETAILED DESCRIPTION OF EMBODIMENTS

Figure 1:
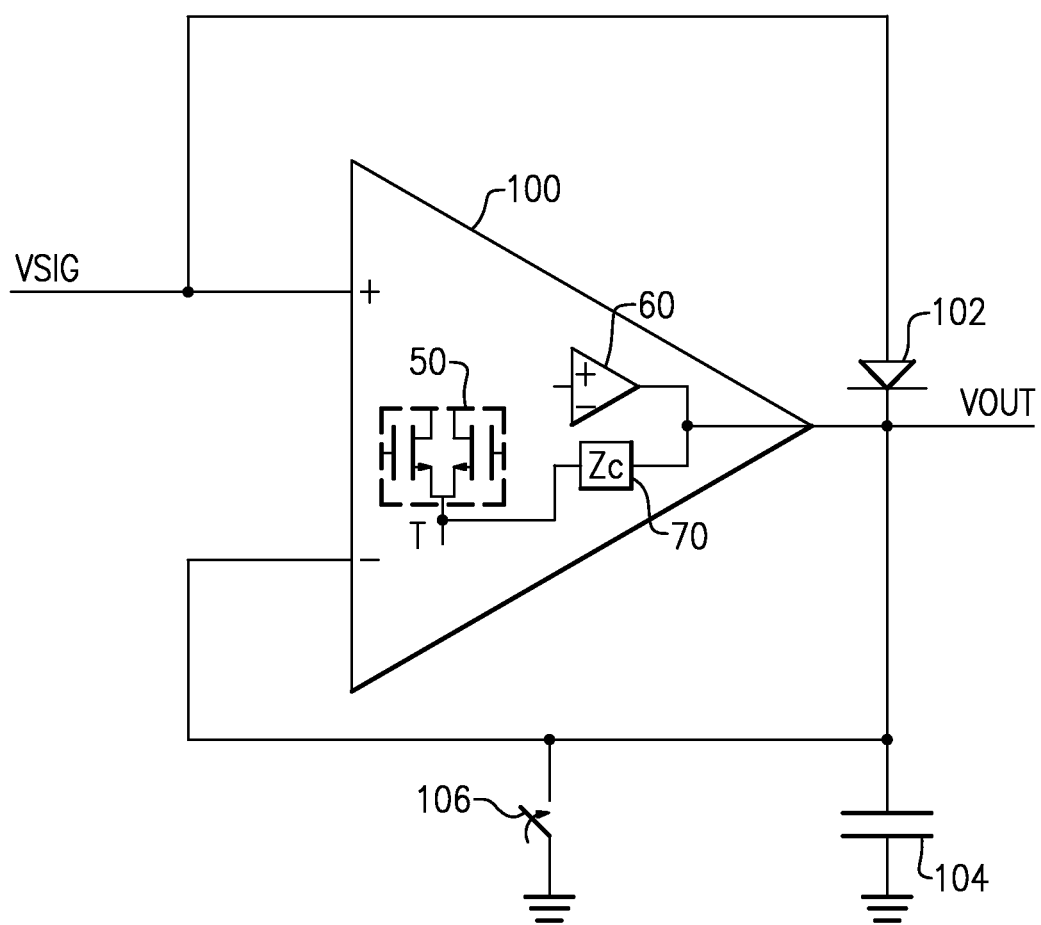
FIG. 1 is a schematic diagram of an application circuit using an op-amp in accordance with the teachings herein.

The following detailed description of embodiments presents various descriptions of specific embodiments of the invention. However, the invention can be embodied in a multitude of different ways as defined and covered by the claims. In this description, reference is made to the drawings in which like reference numerals may indicate identical or functionally similar elements.

An operational amplifier (op-amp) generally has a differential input and a single-ended output and in almost every application is connected in a feedback loop to perform operations or functions. In order for the feedback loop to have stability, the op-amp requires compensation. Desirable properties of an op-amp include large bandwidth and low power consumption. In modern day applications low power consumption is especially important so as to achieve a "green" classification.

Operational amplifiers (op-amps) are one of the key building blocks for any signal conditioning circuit. In a system having gain blocks and data converters, the gain blocks and data converters can be limited by a power dissipation of op-amps used within the system. In many of these systems, the power consumption of the op-amps can contribute a significant amount of the total power dissipation; and there can be a direct relationship between bandwidth and power dissipation.

In CMOS and bipolar analog circuits, an op-amp can be compensated using a shunt (Miller) compensation capacitor. A shunt connection is simple and does not require modification of active transistors, such as a differential pair, within an op-amp topology. For instance, Miller compensation does not require splitting transistors, such as NMOS, into additional devices. Miller compensation is a simple connection of a compensation capacitor or passive network between an output node and an internal gate/base node of a CMOS/bipolar transistor.

However, while Miller compensation offers an advantage in having a simple shunt connection, it does have disadvantages. In a fine geometry CMOS process, such as a 40 nm linewidth CMOS process, using a Miller compensation capacitor can degrade the bandwidth of a low power system. First, the fine geometry CMOS process is limited to low voltage circuit design approaches which can exclude performance enhancing cascoding techniques. Second, the Miller compensation capacitor can have a large capacitance value. Thus, the Miller compensation capacitor can by design degrade a bandwidth of the system and decrease performance parameters such as power supply rejection ratio (PSRR) which would have otherwise been improved with the use of a cascoding technique. Furthermore, a large value Miller compensation capacitor can consume a large silicon area, thereby leading to higher production costs.

Accordingly, using a Miller compensation capacitor can degrade the performance of a fine linewidth CMOS operational amplifier. Therefore, there is a need for an alternative to a Miller compensation capacitor in a fine linewidth CMOS op-amp.

Provided herein are apparatus and methods for compensating an operational amplifier. A tail-current node (T-node) connected compensation capacitor, having relatively low capacitance, can provide compensation to a fine linewidth CMOS op-amp. In this manner, the T-node connected compensation capacitor approach improves bandwidth, reduces power consumption, and enhances performance of the fine linewidth CMOS op-amp.

FIG. 1 is a schematic diagram of an application circuit using an op-amp 100 in accordance with the teachings herein. In this embodiment the application circuit is a peak detector comprising a diode 102, a switch 106, and an output capacitor 104. A non-inverting input terminal of the the op-amp 100 is electrically connected to an anode of the diode 102. An inverting input terminal of the op-amp is electrically connected to an output terminal of the op-amp 100 and to a cathode of the diode 102. In this way the output terminal of the op-amp provides an output signal Vout retaining peak values of an input signal Vsig received at the non-inverting node of the op-amp 100. The output capacitor 104 is electrically connected between the output terminal of the op-amp 100 and ground to reduce voltage droop, defined as a reduction of the voltage at the output terminal due to charge loss. The switch 106 is electrically connected between the output terminal of the op-amp 100 and ground to provide a reset function. Desirable properties of the op-amp 100 are high slew rate to detect relatively high peak voltages of the input signal Vsig and low operating quiescent to reduce power consumption.

The op-amp 100 includes an NMOS differential pair 50, a differential to single-ended amplification stage 60, and a compensation network 70 to achieve high slew rate and to reduce power consumption. By having the compensation network 70 electrically connected between the output of the amplification stage 60 and a tail-current node T, the op-amp 100 can have relatively high bandwidth while operating with relatively low quiescent. This in turn allows the op-amp 100 to have a relatively high slew rate while consuming less power.

Figure 2A:
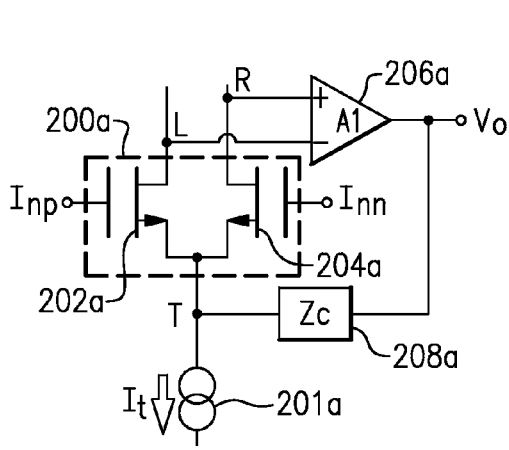
FIGS. 2A-2G are schematic diagrams of various embodiments of an op-amp circuit using compensation in accordance with the teachings herein.

FIGS. 2A-2G are schematic diagrams of various embodiments of an op-amp circuit using compensation in accordance with the teachings herein. FIG. 2A is an embodiment having a differential pair 200a, a differential to single-ended amplification stage 206a, and a compensation network 208a. The differential pair 200a has a first NMOS 202a and a second NMOS 204a. The first NMOS 202a and the second NMOS 204a form a source coupled pair showing a source of the first NMOS 202a electrically connected to a source of the second NMOS 204a at a tail-current node T. The tail-current node T can also be referred to as a coupling node of the differential pair. A gate of the first NMOS 202a operates as the non-inverting input terminal Inp while a gate of the second NMOS 204a operates as the inverting input terminal Inn. The tail-current node T is connected to a current source 201a which provides a tail current $I_t$ to the differential pair 200a. Those practiced in the art of differential amplifiers and design can appreciate the many circuit approaches for realizing the current source 201a. For instance, the current source 201a can be realized by a circuit element, such as a CMOS transistor having a constant gate bias, to provide the tail current $I_t$. In this manner, as known to those practiced in the art of differential amplifier design, the tail-current node T behaves as a high-impedance node. Also, a drain of the first NMOS 202a and a drain of the second NMOS 204a can provide a differential signal between a node L and a node R of the differential pair 200a. The differential to single-ended amplification stage 206a receives the differential signal between the node L and the node R and converts the differential signal to a single-ended signal at an output terminal Vo. The compensation network 208a is electrically connected between the output terminal Vo and the tail-current node T of the differential pair 200a.

Having the compensation network 208a electrically connected between the output Vo and the tail-current node T of the differential pair 200a, can advantageously improve circuit performance and bandwidth by not significantly affecting power supply rejection ratio (PSRR) and by not significantly loading an internal node. The compensation current from the output Vo is being fed-back to the tail-current node T operating as a low impedance node. Because the T-node is an internal node with low impedance, it is not loaded by the compensation network; thus, the unity gain frequency of the overall op-amp increases.

The PSRR of FIG. 2A can be enhanced because the T-node is an internal node which does not directly couple to a positive supply rail. Therefore, a signal path from the positive supply rail to the T-node through the compensation network 208a will have relatively high attenuation. The relatively high attenuation of this path can advantageously enhance PSRR with respect to the positive supply rail.

Figure 2B:
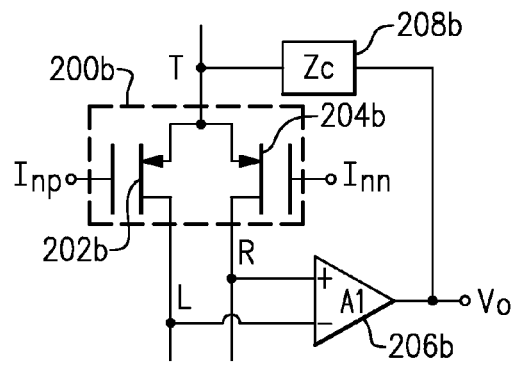

The embodiments of FIGS. 2B-2F are similar in design to the embodiment of FIG. 2A. FIG. 2B is a PMOS equivalent of FIG. 2A having a differential pair 200b and a single-ended amplification stage 206b. Similar to that of FIG. 2A a compensation network 208b is electrically connected between an output Vo and a tail-current node T of the differential pair 200b. In this case the differential pair 200b has a first PMOS 202b and a second PMOS 204b which also operate as a source coupled pair. The differential pair 200b uses complementary devices, PMOS, as compared to the devices of the differential pair 200a of FIG. 2A; therefore, the PSRR can be improved with respect to a negative supply rail or with respect to ground. A relatively high attenuation path between the negative supply rail (or ground) and the output can exist because the T-node does not directly couple to the negative supply rail (or ground). Hence a signal path from the negative supply rail to the T-node through the compensation network 208b can have relatively high attenuation.

Figure 2C:
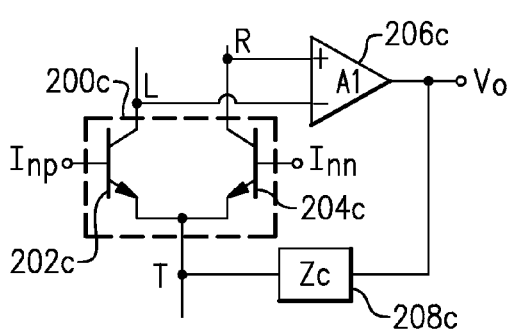
Figure 2D:
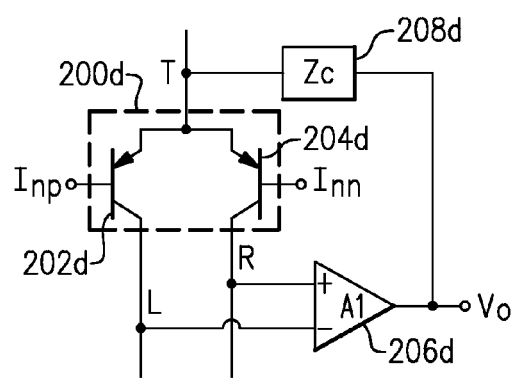

FIG. 2C is a bipolar junction transistor (BJT) realization having a differential pair 200c and a single-ended amplification stage 206c. A compensation network 208c is electrically connected between an output Vo and a tail-current node T of the differential pair 200c. In this case the differential pair 200c has a first NPN 202c and a second NPN 204c which also operate as an emitter coupled pair. Similarly FIG. 2D is a BJT realization having a differential pair 200c and a single-ended amplification stage 206c. In this case the differential pair 200d has a first PNP 202d and a second PNP 204d.

Figure 2E:
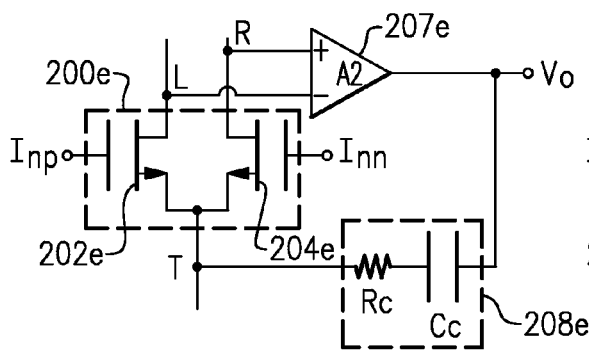
Figure 2F:
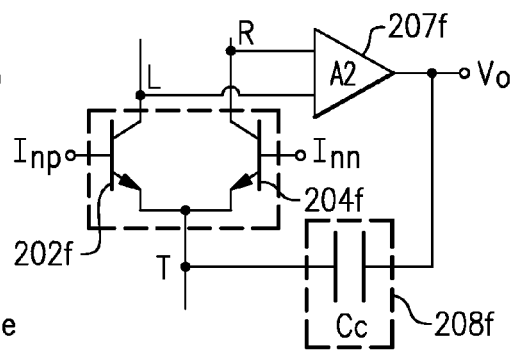

FIG. 2E shows an embodiment similar to FIG. 2A, except more schematic detail of a compensation network 208e is shown. The compensation network 208e has a series connected compensation resistor Rc and compensation capacitor Cc connected between the output of a single-ended amplification stage 206e and a tail-current node T of a differential pair 200e. Having both the compensation resistor Rc and the compensation capacitor Cc can advantageously enhance stability. In the embodiment of FIG. 2F a compensation network 208f can be realized with just a compensation capacitor Cc connected between an output of a single-ended amplification stage 206f and a tail-current node T of a differential pair 200f.

Figure 2G:
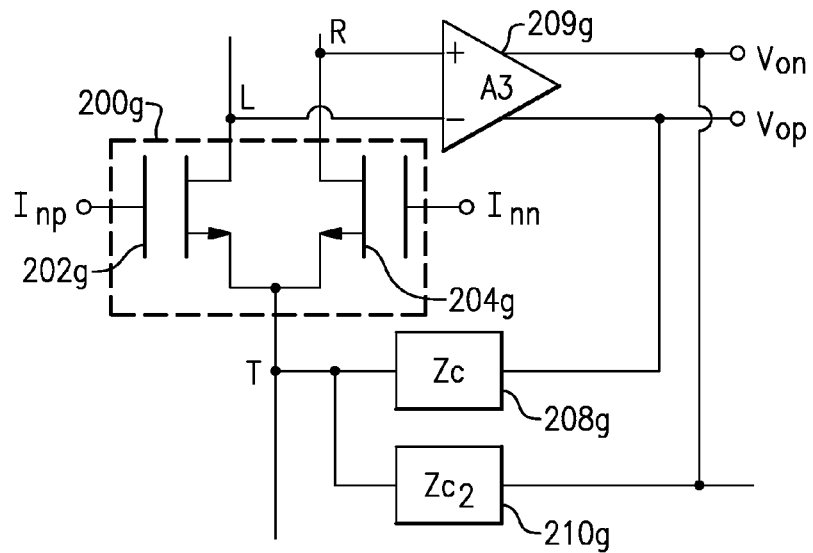

FIG. 2G is a differential output embodiment having a differential-to-differential amplification stage 206g. FIG. 2G is an embodiment having a differential pair 200g, the differential to differential amplification stage 206g, and a compensation network 208g. The differential pair 200g has a first NMOS 202g and a second NMOS 204g forming a source coupled pair at a tail-current node T and providing a differential signal between a first node L and a second node R of the differential pair 200g. In contrast to the previous FIGS. 2A-2F, the differential-to-differential amplification stage 206g provides a differential output between a first output Vop and a second output Von. Compensating an op-amp having a differential output can require more than one compensation network as shown. The embodiment of FIG. 2G has a first compensation network 208g electrically connected between the first output Vop and the tail-current node T and a second compensation network 210g connected between the second output Von and the tail-current node T.

Figure 3:
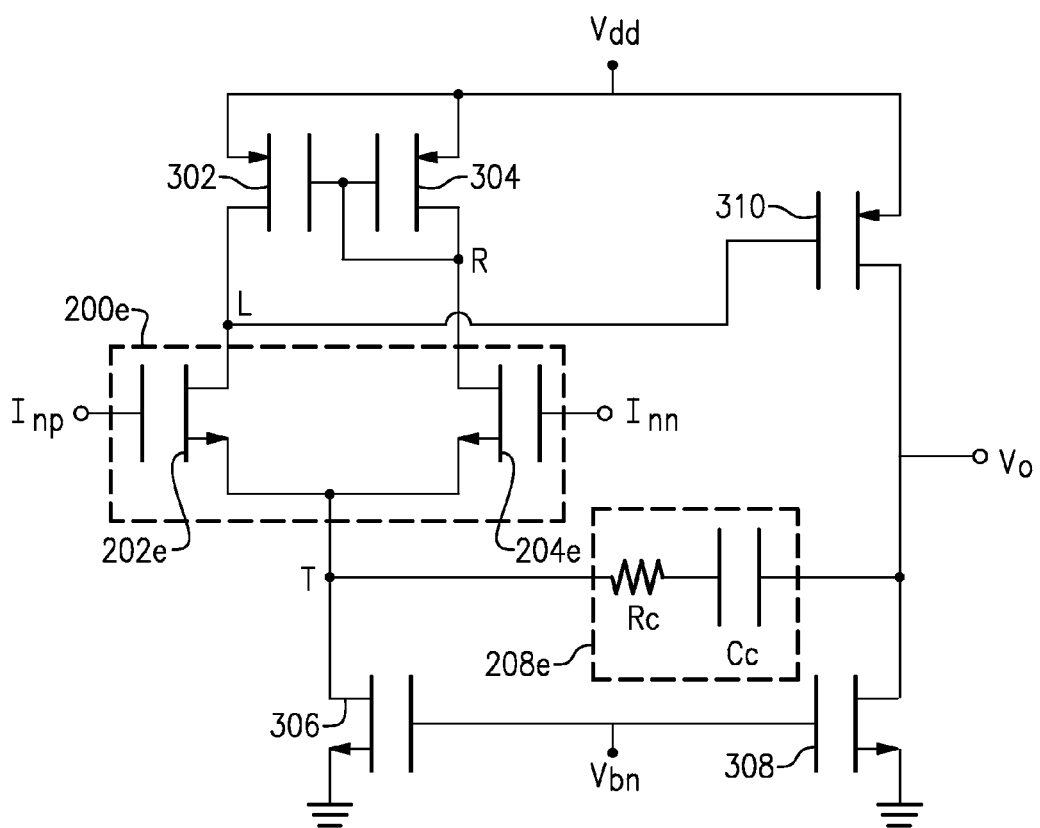
FIG. 3 is a schematic diagram of a two-stage op-amp circuit using compensation according to one embodiment.

FIG. 3 is a schematic diagram of a two-stage op-amp circuit using compensation according to one embodiment. The two-stage op-amp has a differential pair 200e, a first PMOS 302, a second PMOS 304, a third PMOS 310, a compensation network 208e, a third NMOS 306, and a fourth NMOS 308. The differential pair 200e is similar to that of FIG. 2E having a first NMOS 202e and a second NMOS 204e connected in a common source configuration connected at a common tail-current node T. The differential pair 200e further has an inverting input Inn and a non-inverting input Inp with a differential output between a first node L and a second node R. Compared to FIG. 2E, FIG. 3 provides additional schematic detail showing a current mirror formed by the first PMOS 302 and the second PMOS 304.

Those skilled in the art of analog design can recognize the first PMOS 302 and the second PMOS 304 form an active load which can operate to convert the differential signal between the first node L and the second node R into a single-ended signal. The single-ended signal is provided at the first node L by virtue of the current mirror connection. A source of the first PMOS 302 and a source of the second PMOS 304 are electrically connected to a supply node Vdd. A drain of the first PMOS 302 is electrically connected to a drain of the first NMOS 202e to form the first node L. Similarly a drain of the second PMOS 304 is electrically connected to a drain of the second NMOS 204e to form the second node R.

A tail-current is provided at the tail-current node T by the third NMOS 306. The third NMOS 306 has a drain connected to the tail-current node T, a source electrically connected to ground, and a gate electrically connected to a bias potential node Vbn. A bias voltage at the bias potential node Vbn causes the third NMOS transistor 306 to operate as a current source and to provide a DC tail-current.

The third PMOS 310 and the fourth NMOS 308 are electrically connected to operate as a second amplification stage providing an output voltage at an output node Vo. The third PMOS 310 has a source electrically connected to the supply node Vdd, a drain electrically connected to the output node Vo, and a gate electrically connected to the first node L. The third PMOS 310 amplifies a signal of the first node L and has gain determined, in part, by an output loading impedance of the fourth NMOS 308 which has a drain electrically connected to the drain of the third PMOS 310. The fourth NMOS 308 also has a source electrically connected to ground and a gate electrically connected to the bias potential node Vbn.

Connecting the compensation network 208e between the output node Vo and the tail-current node T can advantageously enhance the performance of the op-amp of FIG. 3. For instance, using the compensation network 208e between the output node Vo and the tail-current node T improves bandwidth, PSRR, and slew rate compared to using a Miller compensation network. By comparison the bandwidth can be increased by as much as a factor of three.

Further, connecting the compensation network 208e between the output node Vo and the tail-current node T allows the op-amp of FIG. 3 to operate with reduced ground current while enhancing desirable properties including bandwidth, slew rate, and power supply rejection ratio (PSRR). A signal path from the supply Vdd through the feedback network can have relatively high attenuation. The compensation capacitor Cc can be relatively small and isolated from the supply Vdd by virtue of a low impedance of the tail-current node T. Additionally, a destabilizing right-half-plane zero is eliminated because a feed-forward compensation current component from the output is removed by the differential pair 200e.

Having the compensation network configured as shown in FIG. 3 also advantageously improves PSRR in fine linewidth CMOS where NMOS and PMOS (CMOS) devices with 55 nm or less gate length limit the supply voltage at the supply node Vdd.

Figure 4:
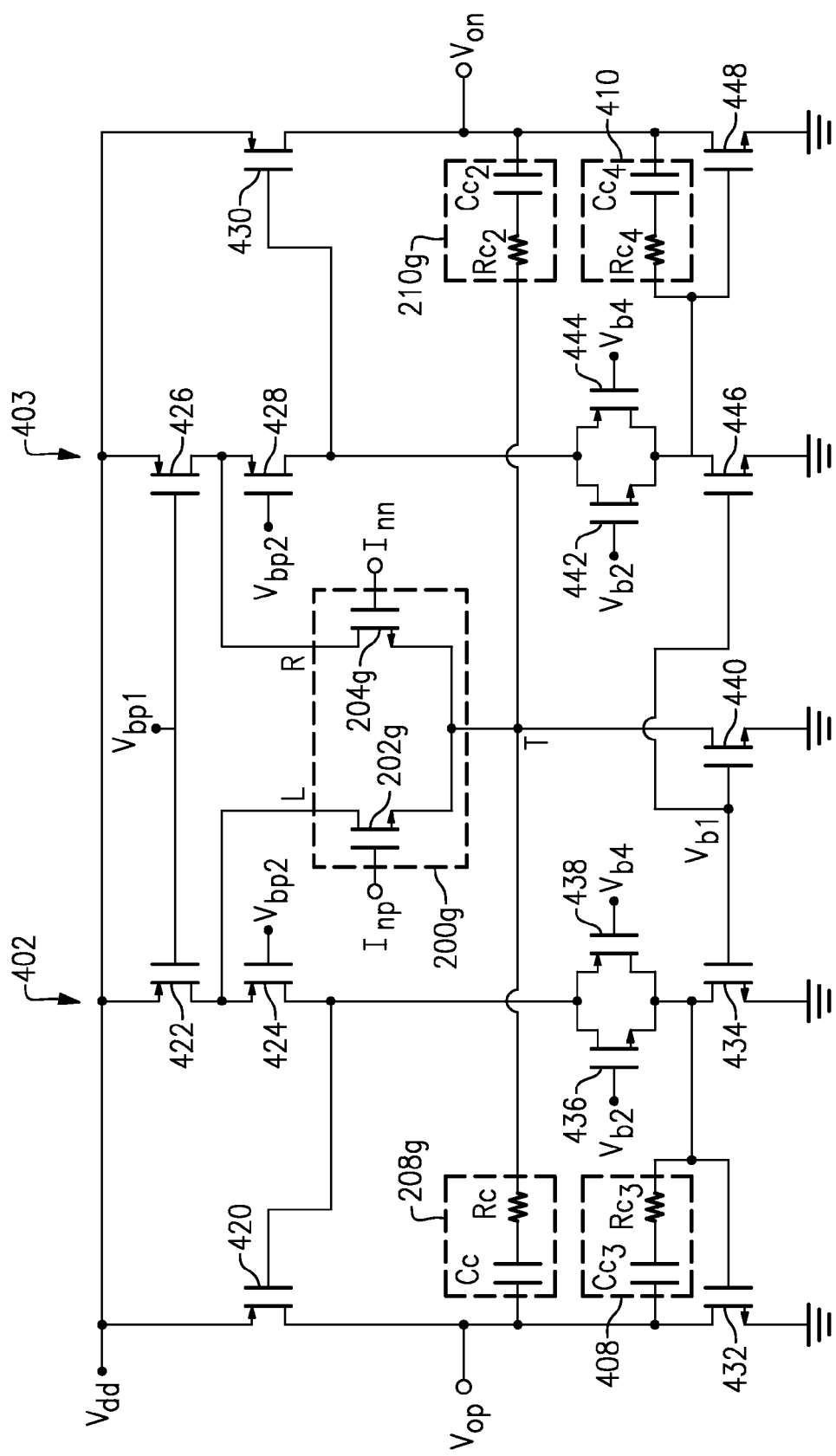
FIG. 4 is a schematic diagram of a folded-cascode op-amp circuit with a class-AB output stage using compensation according to another embodiment.

FIG. 4 is a schematic diagram of a folded-cascode op-amp circuit with a class AB output stage using compensation according to another embodiment. Similar to the op-amp of FIG. 2G, the folded-cascode op-amp of FIG. 4 has a differential input and a differential output. An input differential pair 200g is electrically connected as a source coupled pair to a tail-current node T and receives an input differential signal between a first input node Inp and a second input node Inn. Similar to the embodiment of FIG. 2G, the differential pair 200g consists of a first NMOS 202g having a gate electrically connected to a first input Inp and a second NMOS 204g having a gate electrically connected to a second input node Inn. A third NMOS 440 has a drain electrically connected to the tail-current node T, a source electrically connected to ground, and a gate electrically connected to a bias node Vb1. A DC bias voltage is applied to the bias node Vb1 so that the third NMOS 440 operates as a current source providing tail current at the tail-current node T.

In the configuration of FIG. 4 a differential input voltage signal between the first input node Inp and the second node Inn is amplified through the folded-cascode op-amp to provide a differential output voltage between a first output node Vop and a second output node Von. The folded cascode has a first cascode branch 402 defined by a first PMOS 422 having a source electrically connecting the top of the branch to a supply node Vdd, a second PMOS 424 having a source electrically connected to a drain of the first PMOS 422 at a first node L, a fourth NMOS 434, a fifth NMOS 436, and a third PMOS 438. The purpose of the first cascode branch 402 is to provide amplification from the first input Inp to the first node L. This in turn provides an amplified signal to a gate of a fourth PMOS 420 and to a gate of a sixth NMOS 432. The fifth NMOS 436 and the third PMOS 438 allow the op-amp to operate as a class AB amplifier. Circuit nodes labelled Vbp1, Vbp2, Vb1, Vb2, and Vb4 are bias nodes which receive DC bias potentials for operating the folded cascode op-amp in class AB mode. Those skilled in the art of designing folded cascode amplifiers can recognize the configuration of the differential pair 200g with the first cascode branch 402 as a common design approach and further details of common operation and further details concerning bias connections are omitted.

The fourth PMOS 420 and the sixth NMOS 432 provide a non-inverting component of the differential output voltage at the first output node Vop. The first output node Vop is electrically connected to a drain of the fourth PMOS 420 and to a drain of the sixth NMOS 432. A source of the fourth PMOS 420 is electrically connected to the supply node Vdd and a source of the sixth NMOS 432 is electrically connected to ground. In this way the non-inverting component of the differential output voltage can have a wide output swing between ground and supply.

The folded cascode also has a second cascode branch 403 defined by a fifth PMOS 426 having a source electrically connecting a node of the second cascode branch 403 to the supply node Vdd, a sixth PMOS 428 having a source electrically connected to a drain of the fifth PMOS 426 at a second node R, a seventh NMOS 446, a eighth NMOS 442, and a seventh PMOS 444. The purpose of the second cascode branch 403 is to provide amplification from the second input Inn via the second node R similar to the manner in which the first cascode branch 402 provides amplification from the first input Inp. Additionally, by symmetry the description concerning connections and operation of the second cascode branch 403 is similar to the description concerning connections and operation of the first cascode branch 402.

An eighth PMOS 430 and a ninth NMOS 448 provide an inverting component of the differential output voltage at the second output node Von. By symmetry the description concerning the connections and operation of the eighth PMOS 430 and the ninth NMOS 448 is similar to that of the fourth PMOS 420 and the sixth NMOS 432.

In compensating the folded cascode amplifier of FIG. 4, a first compensation network is electrically connected between the first output node Vop and the tail-current node T, while a second compensation network is electrically connected between the second output node Von and the tail-current node T. In the configuration shown in FIG. 4, the first compensation network has a first compensation capacitor Cc and a first compensation resistor Rc electrically connected in series. Similarly, the second compensation network has a second compensation capacitor Cc2 and a second compensation resistor Rc2 electrically connected in series. Additionally, the folded cascode amplifier includes a third compensation network 408 having a third capacitor Cc3 and a third resistor Rc3 electrically connected in series between the first output node Vop and the gate of the sixth NMOS 432. Also, the folded cascode amplifier includes a fourth compensation network 410 electrically connected in series between the second output node Von and the gate of the ninth NMOS 448.

Having the first compensation network 208g electrically connected from the first output node Vop to the tail-current node T and the second compensation 210g electrically connected from the second output node Von to the tail-current node T advantageously allows the use of relatively smaller capacitors. For instance, the first compensation capacitor Cc and the second compensation capacitor Cc2 can be made relatively small. Using smaller compensation capacitors, the folded cascode op-amp of FIG. 4 can operate with lower quiescent current, thereby consuming less power. Additionally, both bandwidth and PSRR with respect to the supply node Vdd of the folded cascode amplifier of FIG. 4 can be relatively large by virtue of having the first compensation network 208g and the second compensation network 210g. A first signal path including the first compensation network 208g to the first output node Vop from the supply node Vdd and a second signal path including the second compensation network 210g to the second output node Von from the supply node Vdd can have relatively high attenuation.

Although FIG. 4 presents one configuration of the folded cascode amplifier having the first compensation network 208g and the second compensation network 210g, other configurations are possible. For instance, the folded cascode amplifier could be designed to use an alternative differential pair 200 using PMOS instead of NMOS. Or the folded cascode could use an alternative class AB stage.

Figure 5A:
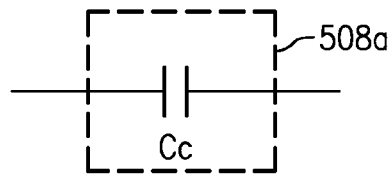
FIGS. 5A-5D are schematic diagrams of various embodiments of a compensation network in accordance with the teachings herein.
Figure 5B:
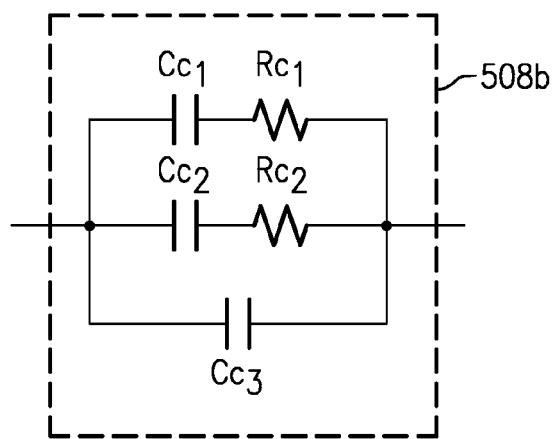
Figure 5C:
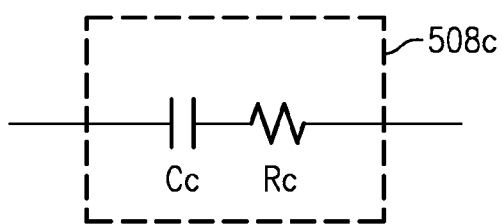
Figure 5D:
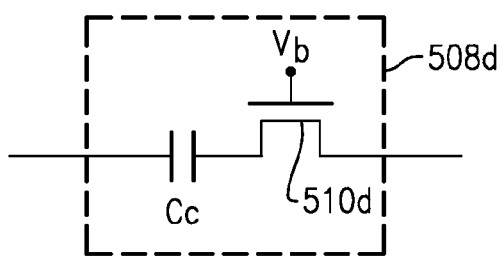

FIGS. 5A-5D are schematic diagrams of various embodiments of a compensation network in accordance with the teachings herein. As known to those practiced in the art of designing compensation networks, there are many permutations of passive elements and/or active devices which can be used as a compensation network. Each of FIGS. 5A-5D can be selected to operate as a compensation network electrically connected between an output node and a tail-current node T. FIG. 5A shows a compensation network 508a having just a compensation capacitor Cc which can be suited for BJT op-amps. FIG. 5B shows a compensation network 508b which has a parallel combination of a first compensation capacitor Cc1 in series with a first compensation resistor Rc1, a second compensation capacitor Cc2 in series with a second compensation resistor Rc2, and a third compensation capacitor Cc3. Each capacitor of the compensation network 508b can introduce a pole into the network function while each resistor capacitor combination can introduce a zero. FIG. 5C shows a compensation network 508c having a compensation capacitor Cc in series with a compensation resistor Rc. This configuration is suitable for a CMOS op-amp requiring the cancelation of a right half plane (RHP) zero. And FIG. 5D shows a compensation network 508d having a compensation capacitor Cc and a CMOS transistor 510d operating in a linear device region. The CMOS transistor 510d can be either an NMOS or a PMOS receiving a fixed potential Vb such that it operates similar to a resistor and replaces the compensation resistor Rc of the compensation network 508c.

Applications

Devices employing the above described compensated op-amps can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks. The consumer electronic products can include, but are not limited to, an automobile, a camcorder, a camera, a digital camera, a portable memory chip, a washer, a dryer, a washer/dryer, a copier, a facsimile machine, a scanner, a multifunctional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An amplifier comprising:
a differential transistor input pair, wherein the differential transistor input pair comprises a first transistor and a second transistor directly and electrically connected to a tail current node;
an amplification stage having an input electrically coupled to the differential transistor input pair and an output; and
a compensation network electrically connected between the output and the tail current node such that a tail current of the tail current node comprises a current of the first transistor plus a current of the second transistor and without a current of the compensation network;
wherein the tail current node is configured to be a high impedance node;
wherein the amplifier is configured to operate in a feedback loop; and
wherein the compensation network is configured to provide stability to the feedback loop.

2. The amplifier of claim 1, wherein a circuit element configured to provide the tail current is electrically connected to the tail current node.

3. The amplifier of claim 2, wherein the circuit element is a field effect transistor (FET) having a drain electrically connected to the tail current node.

4. The amplifier of claim 2, wherein the first transistor and the second transistor are FET transistors, and wherein a source of the first transistor and a source of the second transistor are both electrically connected to the tail current node.

5. The amplifier of claim 4, wherein FET transistors are NMOS transistors.

6. The amplifier of claim 2, wherein the first transistor and the second transistor are bipolar junction transistors (BJTs), and wherein an emitter of the first transistor and an emitter of the second transistor are both electrically connected to the tail current node.

7. The amplifier of claim 6, wherein the BJTs are NPN transistors.

8. The amplifier of claim 1, wherein the compensation network comprises a capacitor.

9. The amplifier of claim 8, wherein the compensation network comprises a resistor connected in series with the capacitor.

10. The amplifier of claim 8, wherein the compensation network comprises an FET electrically connected in series with the capacitor.

11. An operational amplifier comprising:
a differential transistor pair each transistor having a control terminal, a first end and a second end, wherein one of the first ends comprises an output, wherein the second ends are directly coupled together forming a common node, and wherein input signals on the control terminals control the flow of current between the first end and the second end;
an amplifier stage having inputs that receives output signals from outputs of the transistors of the differential transistor pair and then provides a first amplified output; and
a compensation network that interconnects the first amplified output to the common node of the differential pair;
wherein the common node is configured to be a high impedance node;
wherein the operational amplifier is configured to operate in a feedback loop; and
wherein the compensation network is configured to stabilize the feedback loop and to increase a power supply rejection ratio with respect to a supply voltage rail.

12. The operational amplifier of claim 11, wherein the common node is electrically connected to a circuit element operating as a current source to provide a tail current to the differential transistor pair.

13. The operational amplifier of claim 11, wherein the differential transistor pair comprises a pair of NMOS transistors, and wherein the common node comprises a node interconnecting the sources of the transistors such that a power supply rejection ratio with respect to a positive supply rail is increased.

14. The operational amplifier of claim 11, wherein the differential transistor pair comprises a pair of PMOS transistors, and wherein the common node comprises a node interconnecting the sources of the transistors such that a power supply rejection ratio with respect to a negative supply rail is increased.

15. The operational amplifier of claim 11, wherein the differential transistor pair comprises a pair of NPN transistors, and wherein the common node comprises a node interconnecting the emitters of the transistors such that a power supply rejection ratio with respect to a positive supply rail is increased.

16. The operational amplifier of claim 11, wherein the differential transistor pair comprises a pair of PNP transistors, and wherein the common node comprises a node interconnecting the emitters of the transistors such that a power supply rejection ratio with respect to a negative supply rail is increased.

17. The operational amplifier of claim 11, wherein the feedback network comprises a compensation network having a capacitor.

18. The operational amplifier of claim 11, wherein the feedback network comprises a series connected capacitor and resistor having a capacitor and a resistor electrically connected in series.

19. The operational amplifier of claim 18, wherein the feedback network further includes a second capacitor electrically connected in parallel with the series connected capacitor and resistor.

20. The operational amplifier of claim 11, wherein the feedback network comprises a compensation network having a capacitor electrically connected in series with a CMOS transistor configured to operate as a resistor.

21. The operational amplifier of claim 11, further comprising a second compensation network,
wherein the amplifier stage further provides a second amplified output such that the second amplified output and the first amplified output operate as a differential output;
wherein the second compensation network interconnects the second amplified output to the common node of the differential pair; and
wherein the second compensation network is configured to stabilize the feedback loop and to increase the power supply rejection ratio with respect to the supply voltage rail.

22. The operational amplifier of claim 21:
wherein the operational amplifier is a folded cascode amplifier; and
wherein the amplifier stage is configured such that the amplifier operates as a class AB amplifier.

* * * * *